(12) United States Patent
Akiba

(10) Patent No.: US 8,709,952 B2
(45) Date of Patent: Apr. 29, 2014

(54) ETCHING METHOD, ETCHING APPARATUS, AND COMPUTER-READABLE RECORDING MEDIUM

(75) Inventor: Aki Akiba, Miyagi (JP)

(73) Assignee: Tokyo Electron Limited (JP)

( * ) Notice: Subject to any disclaimer, the term of this patent is extended or adjusted under 35 U.S.C. 154(b) by 121 days.

(21) Appl. No.: 13/419,547

(22) Filed: Mar. 14, 2012

(65) Prior Publication Data

US 2012/0238100 A1 Sep. 20, 2012

Related U.S. Application Data

(60) Provisional application No. 61/469,141, filed on Mar. 30, 2011.

(30) Foreign Application Priority Data

Mar. 14, 2011 (JP) .................. 2011-055516

(51) Int. Cl.
*H01L 21/302* (2006.01)

(52) U.S. Cl.
USPC ............... 438/710; 216/37; 216/67; 438/689; 438/692; 438/714; 438/715

(58) Field of Classification Search
USPC .............. 216/37, 67; 438/689, 692, 710, 714, 438/715

See application file for complete search history.

(56) References Cited

U.S. PATENT DOCUMENTS

| | | | | |
|---|---|---|---|---|
| 6,300,251 | B1* | 10/2001 | Pradeep et al. | 438/710 |
| 7,049,244 | B2* | 5/2006 | Becker et al. | 438/714 |
| 7,504,338 | B2* | 3/2009 | Du et al. | 438/694 |
| 2002/0037648 | A1* | 3/2002 | Nishizawa | 438/689 |

FOREIGN PATENT DOCUMENTS

JP 2010-245101 10/2010

* cited by examiner

*Primary Examiner* — Lan Vinh
*Assistant Examiner* — Maki Angadi
(74) *Attorney, Agent, or Firm* — Cantor Colburn LLP

(57) ABSTRACT

Provided is an etching method capable of etching even a silicon film that is included in a multi-layered structure by using a resist film or an organic film as a mask, and also capable of integrally etching the silicon film and a silicon oxide film disposed under the silicon film. The etching method which etches the multi-layered structure including the silicon oxide film and the silicon film formed on the silicon oxide film, includes: integrally etching the silicon film and the silicon oxide film included in the multi-layered structure by using a resist film or an organic film as an etching mask and using an etching gas containing a $CH_2F_2$ gas as an etching gas, when the silicon film and the silicon oxide film in the multi-layered structure are etched.

5 Claims, 13 Drawing Sheets

ETCHING METHOD, ETCHING APPARATUS, AND COMPUTER-READABLE RECORDING MEDIUM

CROSS-REFERENCE TO RELATED PATENT APPLICATIONS

This application claims the benefit of Japanese Patent Application No. 2011-55516, filed on Mar. 14, 2011, in the Japanese Patent Office, and U.S. Patent Application No. 61/469,141, filed on Mar. 30, 2011 in the U.S. Patent and Trademark Office, the disclosure of which are incorporated herein in their entirety by reference.

BACKGROUND OF THE INVENTION

1. Field of the Invention

The present invention relates to an etching method, an etching apparatus, and a computer-readable recording medium.

2. Description of the Related Art

Processes of manufacturing a semiconductor integrated circuit apparatus include a process of etching a silicon (Si) film. When the silicon film is etched, a gas containing a hydrogen bromide (HBr) gas or a hydrogen trifluoride ($HF_3$) gas may be used as an etching gas, as disclosed in Patent Reference 1.

However, the gas containing the HBr gas or the $HF_3$ gas etches a resist film or an organic film, too. Thus, in a case where the silicon film existing in a multi-layered structure of the semiconductor integrated circuit apparatus is etched by using a resist film or an organic film as a mask, sufficient mask selectivity may not be obtained.

In addition, in a case of a multi-layered structure, in which a thick silicon oxide film is disposed on a silicon film, an etching apparatus for etching the silicon oxide film is used.

However, the HBr gas or the $HF_3$ gas is not loaded in the etching apparatus for etching the silicon oxide film. Thus, it is difficult to integrally etch the silicon film disposed under the thick silicon oxide film.

[Patent Document 1] Japanese Laid-open Patent Publication No. 2010-245101

SUMMARY OF THE INVENTION

The present invention provides an etching method and an etching apparatus capable of etching a silicon film by using a resist film or an organic film as a mask, even when the silicon film is included in a multi-layered structure, and capable of integrally etching the silicon film and a silicon oxide film disposed under the silicon film, and a computer-readable recording medium for allowing the etching method to be executed in the etching apparatus.

According to an aspect of the present invention, there is provided an etching method for etching a multi-layered structure including a silicon oxide film and a silicon film formed on the silicon oxide film, the etching method including: integrally etching the silicon film and the silicon oxide film included in the multi-layered structure by using a resist film or an organic film as an etching mask and using an etching gas containing a $CH_2F_2$ gas as an etching gas, when the silicon film and the silicon oxide film in the multi-layered structure are etched.

According to another aspect of the present invention, there is provided an etching method for etching a multi-layered structure including a silicon oxide film, a silicon film formed on the silicon oxide film, and a silicon nitride film formed on the silicon film, the etching method including: integrally etching the silicon nitride film, the silicon film, and the silicon oxide film included in the multi-layered structure by using a resist film or an organic film as an etching mask and using an etching gas containing a $CH_2F_2$ gas as an etching gas, when the silicon nitride film, the silicon film, and the silicon oxide film in the multi-layered structure are etched.

According to another aspect of the present invention, there is provided an etching method for etching a multi-layered structure including a first silicon oxide film, a silicon film formed on the first silicon oxide film, a silicon nitride film formed on the silicon film, and a second silicon oxide film formed on the silicon nitride film, the etching method including: integrally etching the second silicon oxide film, the silicon nitride film, the silicon film, and the first silicon oxide film included in the multi-layered structure by using a resist film or an organic film as an etching mask and using an etching gas containing a $CH_2F_2$ gas as an etching gas, when the second silicon oxide film, the silicon nitride film, the silicon film, and the first silicon oxide film in the multi-layered structure are etched.

According to another aspect of the present invention, there is provided an etching apparatus for etching a multi-layered structure including a silicon oxide film and a silicon film formed on the silicon oxide film, the etching apparatus supplying an etching gas containing a $CH_2F_2$ gas to the multi-layered structure as an etching gas, when the silicon film and the silicon oxide film in the multi-layered structure are etched by using a resist film or an organic film as an etching mask.

According to another aspect of the present invention, there is provided a computer-readable recording medium having embodied thereon a program executed in a computer for controlling an etching apparatus, wherein the program allows the computer to control the etching apparatus to execute the etching method according to any one of above described aspects.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Embodiments for Carrying Out the Invention

Figure 1:
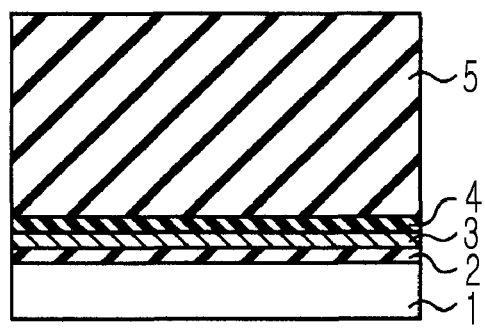
FIG. 1 is a cross-sectional view of a multi-layered structure (semiconductor wafer) in processes of manufacturing a semiconductor integrated circuit apparatus.

Hereinafter, the present invention will be described in detail by explaining exemplary embodiments of the invention with reference to the attached drawings. Like reference numerals in the drawings denote like elements.

FIG. 1 is a cross-sectional view of a multi-layered structure (semiconductor wafer) in processes of manufacturing a semiconductor integrated circuit apparatus.

As shown in FIG. 1, a first silicon oxide film 2 is formed on a silicon substrate 1. A silicon film 3 is formed on the first silicon oxide film 2. A silicon nitride film 4 is formed on the silicon film 3. A second silicon oxide film 5 is formed on the silicon nitride film 4.

In an etching method according to an embodiment of the present invention, the silicon film 3 existing in the multi-layered structure is etched by using a resist film or an organic film as an etching mask. In addition, in the present embodiment, the first silicon oxide film 2 disposed under the silicon film 3 is also etched integrally with the silicon film 3.

FIGS. 2A through 2F are cross-sectional views showing an example of the etching method according to an embodiment of the present invention.

Figure 2A:
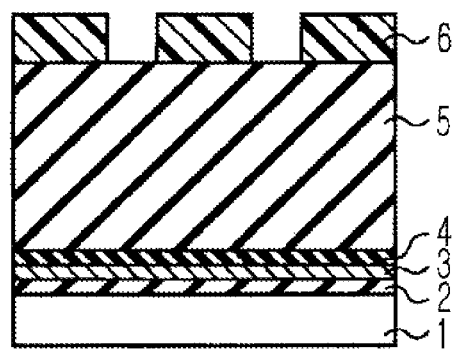
FIGS. 2A through 2F are cross-sectional views showing an example of an etching method according to an embodiment of the present invention.

First, as shown in FIG. 2A, a resist film 6 that becomes an etching mask is formed on the second silicon oxide film 5 by using a photolithography method. The resist film 6 may be an organic film.

Next, the multi-layered structure on which the resist film 6 is formed is carried into a processing chamber of an etching apparatus. Although an example of the etching apparatus will be described later, the etching apparatus may be, for example, a parallel plate type plasma etching apparatus. The multi-layered structure is placed on a holding stage in the processing chamber. The holding stage is a lower electrode. A shower head is provided above the holding stage. The shower head supplies a gas, for example, an etching gas or a purge gas, into the processing chamber, and at the same time, also functions as an upper electrode.

Next, an etching gas containing a difluoromethane ($CH_2F_2$) gas is supplied in the processing chamber of the etching apparatus.

In the present embodiment, a gas in which the difluoromethane ($CH_2F_2$) gas is mixed with a nitrogen ($N_2$) gas and an argon (Ar) gas as a diluting gas is supplied in the processing chamber.

Figure 2B:
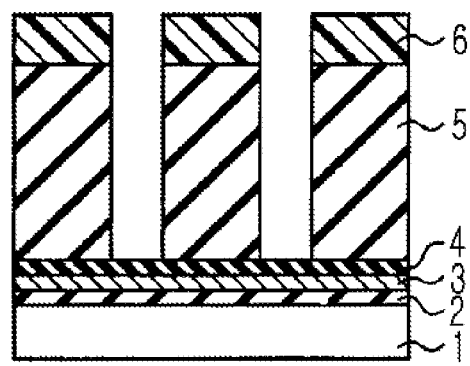
Figure 2C:
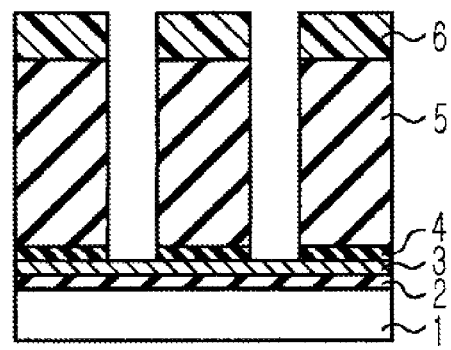
Figure 2D:
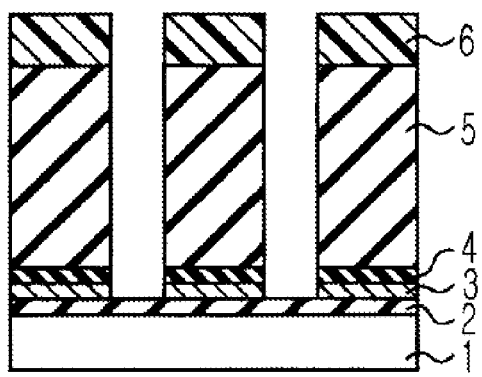
Figure 2E:
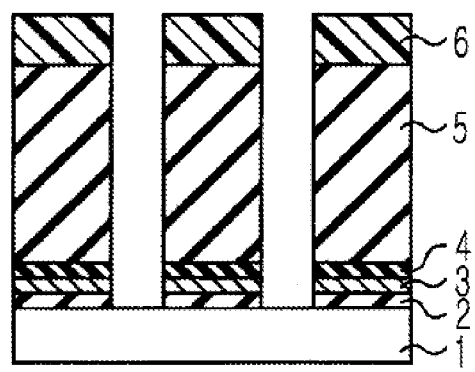
Figure 2F:
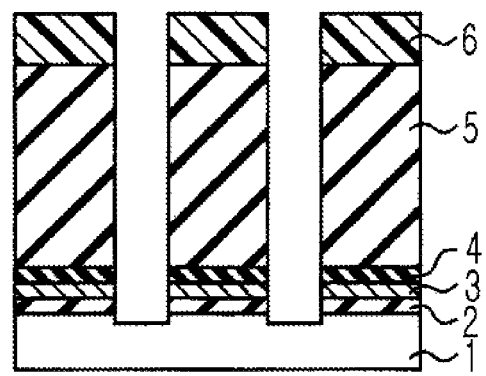

Next, an electric field is applied between the upper electrode and the lower electrode to generate plasma in the processing chamber. Accordingly, after a predetermined time has elapsed, the second silicon oxide film 5 is etched first (FIG. 2B). In addition, after a predetermined time has elapsed, the silicon nitride film 4 is etched (FIG. 2C). Then, after a predetermined time has elapsed, the silicon film 3 is etched (FIG. 2D). Also, after a predetermined time has elapsed, the first silicon oxide film 2 is etched (FIG. 2E). In the present embodiment, the etching is performed to a certain depth of the silicon substrate 1 (FIG. 2F).

Figure 3A:
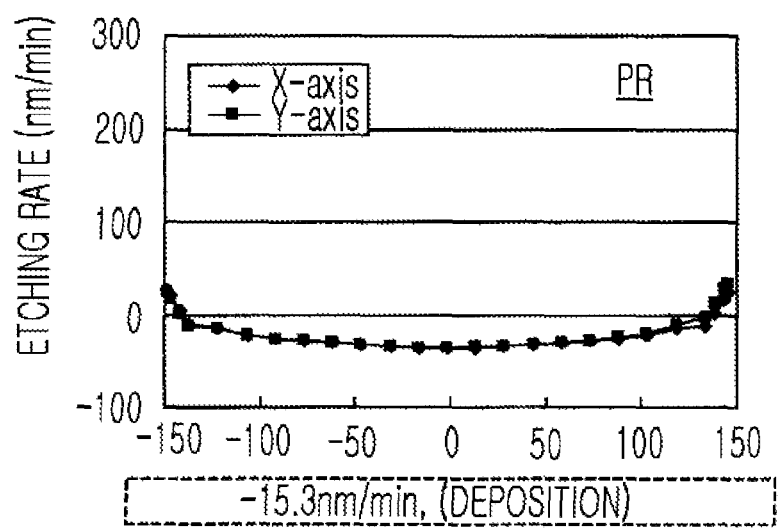
FIG. 3A is a view showing an etching rate of a resist film.
Figure 3B:
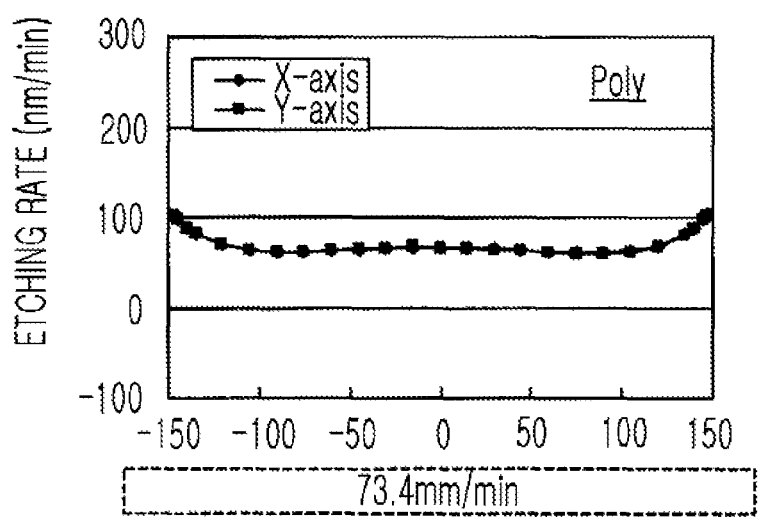
FIG. 3B is a view showing an etching rate of a silicon film.

FIG. 3A is a view showing an etching rate of the resist film 6, and FIG. 3B is a view showing an etching rate of the silicon film 3.

FIGS. 3A and 3B show results obtained under the following etching conditions.

$CH_2F_2$ flow rate: 50 sccm
Ar flow rate: 300 sccm
$N_2$ flow rate: 200 sccm
Processing pressure: 5.32 Pa (0.04 Torr)
Gap between the upper electrode and the lower electrode: 35 mm
Upper electrode power: 2400 W
Lower electrode power: 1000 W As shown in FIG. 3A, the etching rate of the resist film (PR) 6 is −15.3 nm/min. This means that deposits are accumulated on the resist film 6, thereby increasing a film thickness.

On the other hand, as shown in FIG. 3B, the etching rate of the silicon (Poly) film 3 is 73.4 nm/min.

As described above, by using the etching gas containing the $CH_2F_2$ gas as an etching gas, there is a large difference between the etching rates of the resist film 6 and the silicon film 3. Thus, sufficient mask selectivity may be obtained.

Figure 4A:
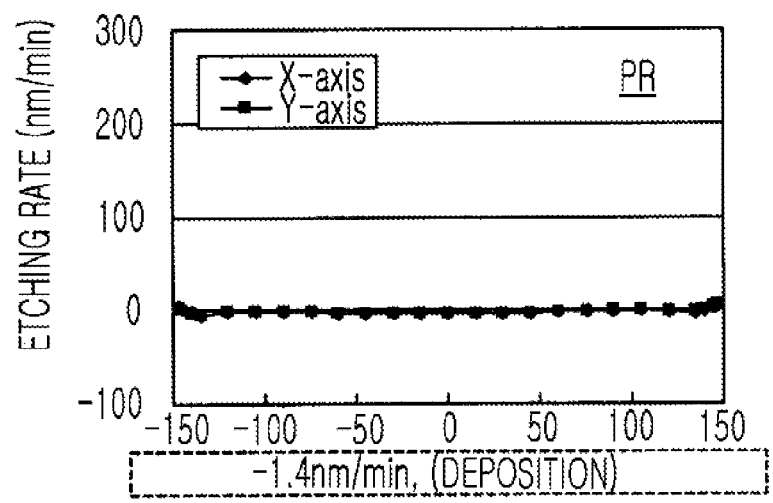
FIG. 4A is a view showing an etching rate of a resist film.
Figure 4B:
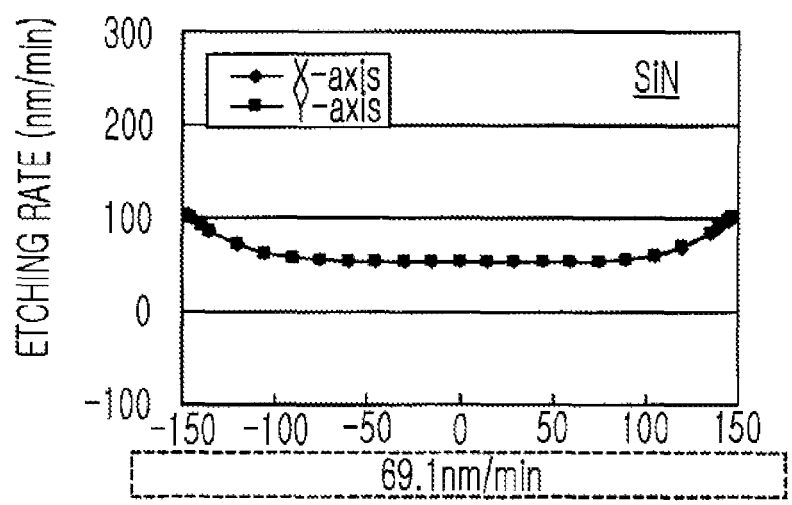
FIG. 4B is a view showing an etching rate of a silicon nitride film.
Figure 4C:
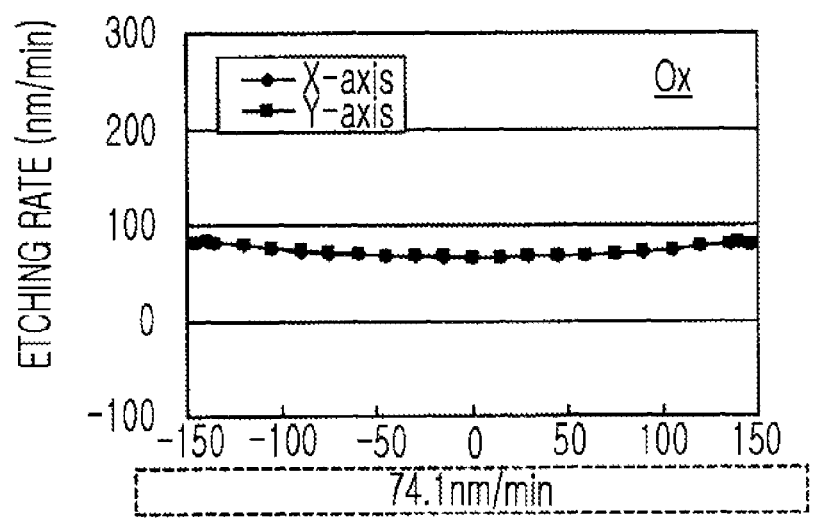
FIG. 4C is a view showing an etching rate of a silicon oxide film.

FIG. 4A is a view showing an etching rate of the resist film 6, FIG. 4B is a view showing an etching rate of the silicon nitride film 4, and FIG. 4C is a view showing an etching rate of the silicon oxide films 2 and 5.

FIGS. 4A through 4C show results obtained under the following etching conditions.

$CH_2F_2$ flow rate: 50 sccm
Ar flow rate: 200 sccm
$N_2$ flow rate: 200 sccm
Processing pressure: 6.65 Pa (0.05 Torr)
Gap between the upper electrode and the lower electrode: 35 mm
Upper electrode power: 500 W
Lower electrode power: 500 W As shown in FIG. 4A, the etching rate of the resist (PR) film 6 is −1.4 nm/min. Although the etching rate is smaller than the result shown in FIG. 3A, this means that deposits are accumulated on the resist film 6, thereby increasing a film thickness.

On the other hand, as shown in FIG. 4B, the etching rate of the silicon nitride (SiN) film 4 is 69.1 nm/min.

In addition, as shown in FIG. 4C, the etching rate of the silicon oxide (Ox) films 2 and 5 is 74.1 nm/min.

As described above, by using the etching gas containing the $CH_2F_2$ gas as an etching gas, there is a large difference between the etching rates of the resist film 6 and the silicon nitride film 4, and between the etching rates of the resist film 6 and the silicon oxide films 2 and 5. Thus, a sufficient mask selectivity may be obtained.

According to the etching method of the present embodiment, by using the etching gas containing the $CH_2F_2$ gas as an etching gas, the resist film 6 is hardly etched, or the deposits are accumulated on the resist film 6, thereby increasing the film thickness. Therefore, the silicon film 3 that is located at a deep portion in the multi-layered structure may be etched by using the resist film 6 or an organic film as an etching mask. In addition, the first silicon oxide film 2 disposed under the silicon film 3 may be integrally etched with the silicon film 3.

Next, an example of an etching apparatus that may execute the etching method according to an embodiment of the present invention will be described.

Figure 5:
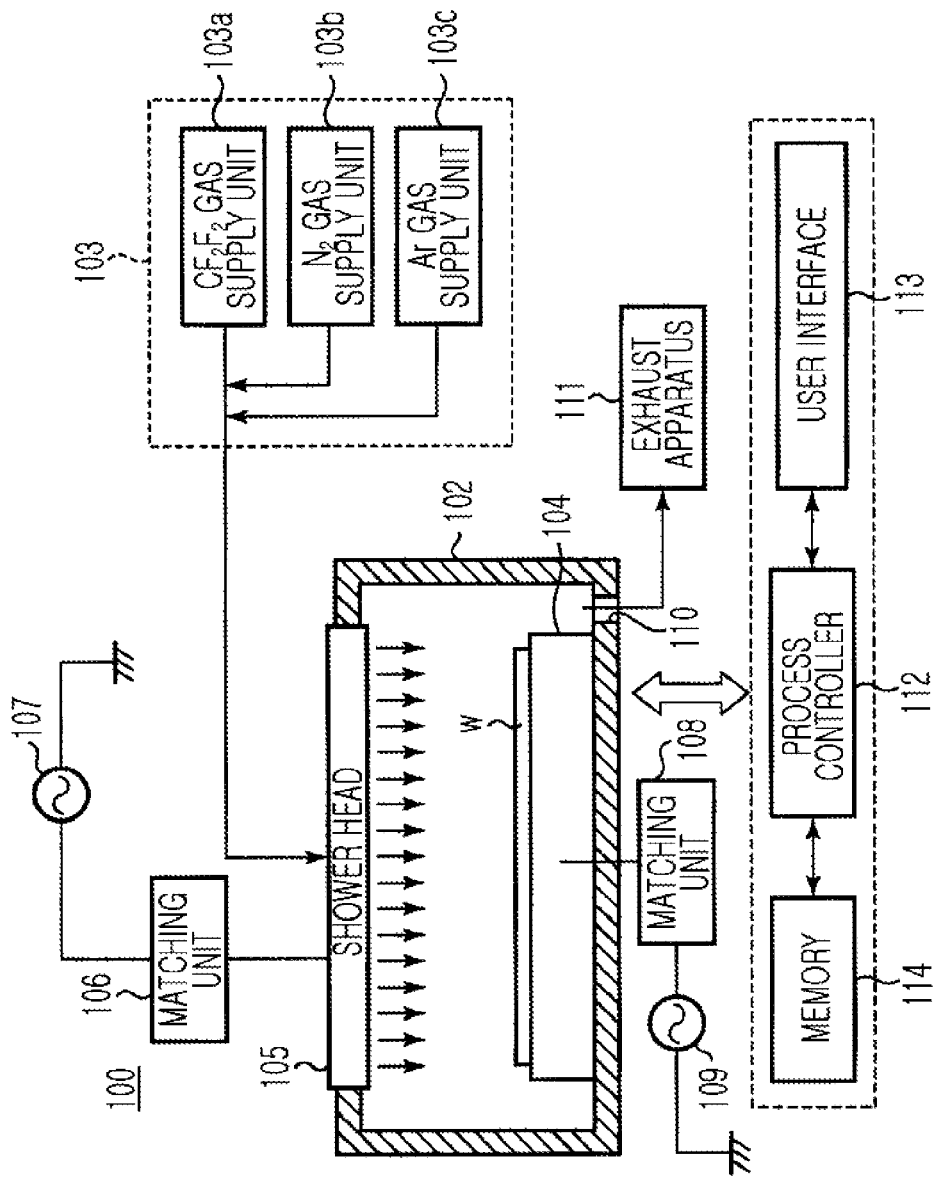
FIG. 5 is a schematic cross-sectional view of an etching apparatus capable of executing the etching method according to an embodiment of the present invention.

FIG. 5 is a cross-sectional view schematically showing an etching apparatus 100 that may execute the etching method according to an embodiment of the present invention.

As shown in FIG. 5, the etching apparatus 100 is a parallel plate type plasma etching apparatus. The etching apparatus 100 includes a processing chamber 102 in which a processing target, which is a semiconductor wafer W in the present embodiment, is processed by using an etching gas, and a gas supply source 103 supplying a gas such as the etching gas into the processing chamber 102. The semiconductor wafer W may include for example a multi-layered structure as shown in FIG. 2A, formed thereon.

In the processing chamber 102, a holding stage 104 for holding the semiconductor wafer W and a processing gas discharging unit, which is a shower head 105 in the present embodiment, disposed to face the holding stage 104 so as to discharge a processing gas such as an etching gas in the processing chamber 102 are provided. The shower head 105 configures an upper electrode of parallel plates, and is connected to a first high frequency power supply 107 via a matching unit 106. The first high frequency power supply 107 outputs a high frequency voltage of, for example, 40 MHz or greater, for example, 60 MHz. Meanwhile, the holding stage 104 configures a lower electrode of the parallel plates, and in the present embodiment, is connected to a second high frequency power supply 109 via a matching unit 108. The second high frequency power supply 109 outputs a high frequency voltage of, for example, a range from 2 MHz to 20 MHz, for example, 13.56 MHz.

In addition, the processing chamber 102 is connected to an exhaust apparatus 111 via an exhaust hole 110. The processing chamber 102 is configured as a vacuum container which may be decompressed to a desired vacuum level. The exhaust apparatus 111 exhausts the inside of the processing chamber 102 configured as the vacuum container so as to decompress the inside of the processing chamber 102 to a desired vacuum level.

The etching apparatus 100 is controlled by a process controller 112 formed of, for example, a micro processor (computer). A user interface 113 and a memory 114 are connected to the process controller 112. The user interface 113 includes a keyboard, through which an operator performs an input manipulation of a command for managing the etching apparatus 100, a display for visibly representing operating states of the etching apparatus 100, and the like. The memory 114 stores a control program for executing various processes performed in the etching apparatus 100 according to control of the process controller 112, or a program allowing each of the components in the etching apparatus 100 to execute the process according to the processing conditions, for example, a recipe. The recipe is stored in, for example, a recording medium in the memory 114. The recording medium may be a hard disk, a semiconductor memory, or a portable memory such as a compact disc (CD)-read only memory (ROM), a digital versatile disc (DVD), or a flash memory. Also, the recipe may be transmitted from another device through, for example, a dedicated line. If necessary, a recipe is read out from the memory 114 according to a command from the user interface 113 or the like, and the process controller 112 performs a process according to the read-out recipe. Thus, the etching apparatus 100 may perform the etching method according to the embodiment under the control of the process controller 112.

The gas supply source 103 includes a $CH_2F_2$ gas supply unit 103a, a $N_2$ gas supply unit 103b, and an Ar gas supply unit 103c for performing the etching method according to the embodiment of the present invention.

The etching method according to the embodiment of the present invention may be performed by using the etching apparatus 100.

As described above, according to the etching method and the etching apparatus of embodiments of the present invention, the silicon film included in the multi-layered structure may be etched by using the resist film or the organic film as a mask, and the silicon film and the silicon oxide film disposed under the silicon film may be integrally etched.

While this invention has been particularly shown and described with reference to exemplary embodiments thereof, but not limited thereto, it will be understood by those skilled in the art that various changes in form and details may be made therein without departing from the spirit and scope of the invention as defined by the appended claims.

For example, in the above embodiment, an example in which the second silicon oxide film 5, the silicon nitride film 4, the silicon film 3, and the first silicon oxide film 2 in the multi-layered structure are integrally etched by using the resist film 6 or the organic film as the etching mask and using the etching gas containing the $CH_2F_2$ gas as an etching gas is described.

However, even if there is no the second silicon oxide film 5, the silicon oxide film 4, the silicon film 3, and the first silicon oxide film 2 included in the multi-layered structure may be integrally etched by using the resist film 6 or the organic film as the etching mask and using the etching gas containing the $CH_2F_2$ gas as an etching gas.

In addition, even if there is no silicon nitride film 4, the silicon film 3 and the first silicon oxide film 2 included in the multi-layered structure may be integrally etched by using the resist film 6 or the organic film as the etching mask and using the etching gas containing the $CH_2F_2$ gas as an etching gas.

In addition, if a film other than the second silicon oxide film 5 is formed or a film other than the silicon nitride film is formed, an etching gas capable of etching the above films is supplied in the processing chamber. Then, after etching the above films, the etching gas is changed to the etching gas containing the $CH_2F_2$ gas such that the silicon nitride film 4, the silicon film 3, and the first silicon oxide film 2 included in the multi-layered structure may be integrally etched.

According to the etching method, the etching apparatus, and the computer-readable recording medium for allowing the etching method to be executed in the etching apparatus of the present invention, even when the silicon film is included in the multi-layered structure, the silicon film can be etched by using a resist film or an organic film as a mask. In addition, the silicon film and a silicon oxide film disposed under the silicon film can be integrally etched.

What is claimed is:

1. An etching method for etching a multi-layered structure including a silicon oxide film and a silicon film formed on the silicon oxide film, the etching method comprising:
    sequentially etching the silicon film and the silicon oxide film included in the multi-layered structure keeping an etching gas by using a resist film or an organic film as an etching mask and using an etching gas containing a $CH_2F_2$ gas as the etching gas, when the silicon film and the silicon oxide film in the multi-layered structure are etched.

2. An etching method for etching a multi-layered structure including a silicon oxide film, a silicon film formed on the silicon oxide film, and a silicon nitride film formed on the silicon film, the etching method comprising:
    sequentially etching the silicon nitride film, the silicon film, and the silicon oxide film included in the multi-layered structure keeping an etching gas by using a resist film or an organic film as an etching mask and using an etching gas containing a $CH_2F_2$ gas as the etching gas, when the silicon nitride film, the silicon film, and the silicon oxide film in the multi-layered structure are etched.

3. An etching method for etching a multi-layered structure including a first silicon oxide film, a silicon film formed on the first silicon oxide film, a silicon nitride film formed on the silicon film, and a second silicon oxide film formed on the silicon nitride film, the etching method comprising:
    sequentially etching the second silicon oxide film, the silicon nitride film, the silicon film, and the first silicon oxide film included in the multi-layered structure keeping an etching gas by using a resist film or an organic film as an etching mask and using an etching gas containing a $CH_2F_2$ gas as the etching gas, when the second silicon oxide film, the silicon nitride film, the silicon film, and the first silicon oxide film in the multi-layered structure are etched.

4. The etching method of claim 1, wherein the etching gas additionally includes a $N_2$ gas, in addition to the $CH_2F_2$ gas.

5. The etching method of claim 1, wherein the etching gas additionally includes an Ar gas as a diluting gas, in addition to the $CH_2F_2$ gas.

* * * * *